United States Patent [19]

Haberern

[11] Patent Number: 5,567,646
[45] Date of Patent: Oct. 22, 1996

[54] METHOD OF MAKING A STRIPE-GEOMETRY II/VI SEMICONDUCTOR GAIN-GUIDED INJECTION LASER STRUCTURE USING ION IMPLANTATION

[75] Inventor: Kevin W. Haberern, Hopewell Junction, N.Y.

[73] Assignee: Philips Electronics North America Corporation, New York, N.Y.

[21] Appl. No.: 471,293

[22] Filed: Jun. 6, 1995

Related U.S. Application Data

[63] Continuation-in-part of Ser. No. 310,194, Sep. 21, 1994, which is a continuation-in-part of Ser. No. 159,755, Nov. 30, 1993, Pat. No. 5,363,395, which is a continuation-in-part of Ser. No. 997,988, Dec. 28, 1992, abandoned.

[51] Int. Cl.$^6$ .................................. H01L 21/20
[52] U.S. Cl. .................... 437/129; 437/20; 437/26; 437/126; 437/133
[58] Field of Search ............... 437/129, 20, 26, 437/133, 126

[56] References Cited

U.S. PATENT DOCUMENTS

| | | | |
|---|---|---|---|
| 4,341,570 | 7/1982 | Landreau et al. | 148/1.5 |
| 4,523,961 | 6/1985 | Hartman et al. | 148/1.5 |
| 5,115,442 | 5/1992 | Lee et al. | 437/129 |
| 5,151,914 | 9/1992 | Vidimari et al. | 372/46 |
| 5,160,492 | 11/1992 | Wang et al. | 437/22 |
| 5,213,998 | 5/1993 | Qiu et al. | 437/129 |
| 5,256,596 | 10/1993 | Ackley et al. | 437/129 |
| 5,351,255 | 9/1994 | Schetzima | 437/129 |
| 5,395,791 | 3/1995 | Cheng et al. | 437/129 |

OTHER PUBLICATIONS

"Proton–Bombardment Formation of Stripe–Geometry Heterostructure Lasers for 300 K CW Operation", Proceedings of the IEEE, Jun. 1972, pp. 726–728.

"Optical and Electrical Properties of Proton–Bombarded p–type GaAs" by J. C. Dymet al, Bell Laboratories, Murray Hill, NJ 07974, Appl. Phys. vol. 44, No. 1, Jan. 1973, pp. 207–213.

Primary Examiner—Robert Kunemund
Assistant Examiner—Ramamohan Rao Paladugu
Attorney, Agent, or Firm—Steven R. Biren

[57] ABSTRACT

A blue, green or blue-green stripe-geometry II/VI semiconductor injection laser utilizing a $Zn_{1-u}Cd_uSe$ active layer (quantum well) having $Zn_{1-x}Mg_xS_ySe_{1-y}$ cladding layers and $ZnS_zSe_{1-z}$ guiding layers is fabricated on a GaAs substrate. The stripe-geometry configuration is obtained by ion implanting a dopant such as Nitrogen or Oxygen into the structure to form blocking layer portions of higher resistivity in the second cladding layer and the second guiding layer. These blocking layer portions are positioned on both sides of, and thereby define, a stripe-shaped lateral confinement region of lower resistivity in the second cladding layer and the second cladding layer.

11 Claims, 5 Drawing Sheets

FIG. 8c

METHOD OF MAKING A STRIPE-GEOMETRY II/VI SEMICONDUCTOR GAIN-GUIDED INJECTION LASER STRUCTURE USING ION IMPLANTATION

CROSS REFERENCE TO RELATED APPLICATIONS

This application is a continuation-in-part of application Ser. No. 310,194, filed Sep. 21, 1994 which is a continuation-in-part of application Ser. No. 159,755, filed Nov. 30, 1993, now U.S. Pat. No. 5,363,395, which in turn is a continuation of application Ser. No. 997,988, filed Dec. 28, 1992.

BACKGROUND OF THE INVENTION

This invention relates to semiconductor lasers and more particularly to the fabrication of gain-guided semiconductor injection lasers made from II/VI materials and operating in the blue, green and blue-green regions.

Semiconductor lasers made from of III/V materials and operating in the red and infrared regions are commonly found in optical data storage applications. If laser devices operating at shorter wavelengths such as green, blue/green and blue were available, the data storage density of optical data storage devices could be increased. However, practical semiconductor laser diodes operating at the shorter wavelengths have not as yet been manufactured. The prior art has focussed on a variety of means for utilizing II/VI materials to provide shorter wavelength semiconductor lasers.

Blue-green II/VI semiconductor injection lasers have been produced by Haase, et al. ("Blue-Green Laser Diodes", Appl. Phys. Lett. 59 (11), 9 Sep. 1991) using a separate-confinement heterostructure (SCH) configuration. These lasers have $ZnS_{0.06}Se_{0.94}$ cladding layers, a ZnSe waveguiding region, and a $Cd_{0.2}Zn_{0.8}Se$ quantum-well active region. Although this configuration has provided room-temperature pulsed and low-temperature continuous operation, it has the disadvantage that it cannot be grown with all layers pseudomorphic to the GaAs substrate. Pseudomorphic lasers can be made without separate confinement, by omitting the ZnSe guiding region, but additional quantum wells are required to compensate for the reduction in optical confinement. Consequently, the threshold current density increases. Also, the improvement in optical confinement obtained by additional quantum wells is limited, because the large lattice mismatch (about 1.5%) between $Cd_{0.2}Zn_{0.8}$ and $ZnS_{0.06}Se_{0.94}$ limits the total thickness of $Cd_{0.2}Zn_{0.8}Se$. Growth of $Zn_{1-x}Mg_xS_ySe_{1-y}$ materials by MBE has been demonstrated by Okuyama, et al (Jap. J. App. Phys. 30, L1620 (1991)). They have implemented $Zn_{1-x}Mg_xS_ySe_{1-y}$ cladding layers in optically pumped lasers operating at temperatures up to 500K and in 77K multi-quantum-well p-n injection lasers without separate confinement. The use of $Zn_{1-x}Mg_xS_ySe_{1-y}$ for II/VI lasers is also shown in U.S. Pat. No. 5,260,958.

In the past, II/VI (typically ZnSe) semiconductor gain-guided injection laser structures have been fabricated using polyimide or nitride/oxide to define the stripe-geometry lateral current confinement region in these laser structures. However, these materials typically have several disadvantages. Polyimide, for example, requires the use of high curing temperatures that are not compatible with II/VI laser materials and is susceptible to the formation of pinholes. Such pinholes can create undesired alternative conduction paths through the laser device, and thereby degrade device performance. Nitride and oxide have adhesion problems and may also detrimentally heat the laser structure during deposition. Furthermore, neither of these techniques will enhance device efficiency by reducing the effect of lateral current spreading during laser operation.

SUMMARY OF THE INVENTION

It is therefore an object of the present invention to provide a method of making stripe-geometry II/VI semiconductor gain-guided injection laser structures in which heating of the laser material is minimized or eliminated, and in which both susceptibility to pinholes and lateral current spreading are minimized or eliminated.

The present invention is directed to the manufacture of a II/VI separate confinement semiconductor injection laser utilizing a $Zn_{1-u}Cd_uSe$ active layer (quantum well) having $Zn_{1-x}Mg_xS_ySe_{1-y}$ cladding layers and $ZnS_zSe_{1-z}$ guiding layers and a GaAs substrate. The devices are operable in pulsed and continuous (CW) modes at room temperature. The use of quaternary $Zn_{1-x}Mg_xS_ySe_{1-y}$ cladding layers permits both lattice matching of all layers, and an increase of the cladding and guiding layer band-gaps. Thus, lasers can be made with improved electrical and optical confinement. Alternatively, the band-gap of the active region may be increased to yield lasing at shorter wavelengths (u=0).

In another injection laser structure at least one or both of the $ZnS_zSe_{1-z}$ guiding layers are left undoped. Additionally, rather than a ZnSe contact layer, a graded contact layer is provided in which the portion of the layer closest to the upper cladding layer is of ZnSe with an upper layer of ZnTe and a portion therebetween which is graded from ZnSe to ZnTe. Both the undoped guiding layers and the graded contact layer have been found to increase the useful life of the device.

The present invention is directed to a method of making stripe-geometry II/VI semiconductor gain-guided injection laser structures such as those described above by a process in which processing problems relating to high-temperature processing, pinhole susceptibility and adhesion are minimized or eliminated, and in which the effect of lateral current spreading is reduced. These advantages are achieved in the method of the present invention by using an ion-implantation technique to form implanted blocking layer portions of higher resistivity which serve to define a stripe-shaped lateral confinement region of lower resistivity within the laser structure. A contact layer is provided at least above the stripe-shaped lateral confinement region, and typically extends above at least a part of the blocking layer portions to provide a wider contact area for easier electrical contact.

In order to optimize the advantages of the present invention, the implantation process may be conducted using ions of nitrogen or oxygen, and the implantation depth may be advantageously selected such that the implanted blocking layer portions are adjacent extend from the surface of the device down to an implantation depth such that the implanted blocking layer portions are adjacent to the active layer. Although hydrogen ions are typically used for implantation in III/V materials, it has been found that nitrogen and oxygen are more suitable for use in implanting II/VI materials.

BRIEF DESCRIPTION OF THE DRAWING

In order to better understand the present invention, reference is made to the accompanying drawing, in which.

It should be noted that the Figures are not drawn to scale, certain dimensions being exaggerated for greater clarity. In the Figures, like reference numerals are used to designate like regions.

DESCRIPTION OF THE PREFERRED EMBODIMENTS

Figure 1A:
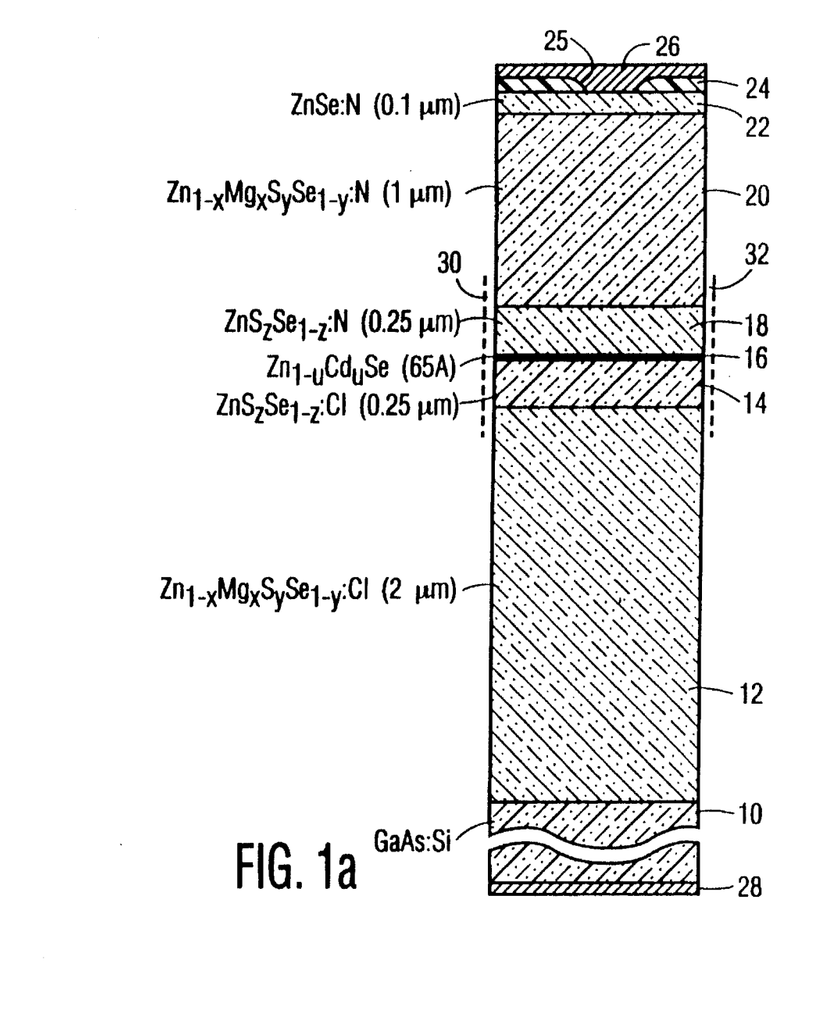
FIG. 1a is a sectional view of the layered structure of a II/VI laser construction and FIG. 1b illustrates the near-field light output of the device.

FIG. 1a illustrates a II/VI semiconductor laser structure. The structure includes a GaAs:Si substrate 10 which, by doping with silicon, is n-type. Grown on the substrate 10 is a cladding layer 12 of $Zn_{1-x}Mg_xS_ySe_{1-y}$:Cl, which, by its doping with Cl is n-type. Grown atop cladding layer 12 is an optical guiding layer 14 of $ZnS_zSe_{1-z}$:Cl which is n-type. Grown atop waveguide layer 14 is the active quantum well layer 16 of $Zn_{1-u}Cd_uSe$. Grown on active layer 16 is a p-type guiding layer 18 comprising $ZnS_zSe_{1-z}$:N. Grown atop guiding layer 18 is a p-type cladding layer 20 of $Zn_{1-x}Mg_xS_ySe_{1-y}$:N. Disposed on layer 20 is a p-type contact layer 22 of ZnSe:N. GaSh-guided lasers were successfully fabricated in accordance with this configuration. A polyimide insulator layer 24 with stripe openings 25 of, by way of example only, 50 µm width is applied to the top of the epitaxial layer 22. Contacts to the p-ZnSe and the n-GaAs were made with a Au layer 26 and a In layer 28, respectively. The device was cleaved to a length of about 1 mm. The devices were typically operated with pulse lengths of 10–50 ns and a repetition rate of 1 kHz (duty cycle=1–5×10$^{-5}$). Successful continuous operation of these devices has also been achieved.

The laser structure shown in FIG. 1a was grown by molecular beam epitaxy (MBE) on a (100) GaAs:Si substrate. Source materials were Zn, Se, Cd, Mg, and ZnS. The p- and n-type dopants were N, excited by a plas. ma source, and Cl (from $ZnCl_2$), respectively. The doping levels ($N_a$–$N_d$) in the p-ZnSe, p-$ZnS_zSe_{1-z}$ and p-$Zn_{1-x}Mg_xS_ySe_{1-y}$ regions are approximately 1×10$^{18}$, 3×10$^{17}$ cm$^{-3}$, and 2×10$^{17}$ cm$^{-3}$, respectively. The doping level in the n-$ZnS_zSe_{1-z}$ and n-$Zn_{1-x}Mg_xS_ySe_{1-y}$ is 2×10$^{17}$ cm$^{-3}$, except for the first 1000Å of the $Zn_{1-x}Mg_xS_ySe_{1-y}$ layer, which is doped at 2×10$^{18}$ cm$^{-3}$. In the exemplary embodiment the $Zn_{1-u}Cd_uSe$ layer has a u value of 0.2. and in the $ZnS_zSe_{1-z}$ layer the value of z was 0.06. For the $Zn_{1-x}Mg_xS_ySe_{1-y}$ layers, x and y are each approximately 0.1. In this embodiment, the band-gap of the $Zn_{1-x}Mg_xS_ySe_{1-y}$, determined by photoluminescence, is about 2.95 eV (at 4K), and the index of refraction (at room temperature), determined by the prism-coupling method, is 2.625 at 515 nm.

The thickness of each of the layers is grown in a manner so as to minimize the loss of light in absorbing layers and maximize the amount of light in the active region. By way of example only, useful devices were formed with a n-type cladding layer 12 of 2 microns, an n-type guiding layer 14 of 0.25 microns, a quantum well layer 16 of 65 Angstroms, a p-type guiding layer 18 of 0.25 microns, a p-type cladding layer 20 of 1 micron, and a p-type contact layer 22 of 0.1 microns. Suitable ranges for u (Cadmium) are from 0 to 0.4, z from 0 to 0.1, y (sulphur) from 0.06 to 1 and x (magnesium) from 0 to 1. However, x and y must be selected so as to provide lattice matching to the GaAs. In practical embodiments x (the amount of Magnesium) generally ranges from 0.08 to 0.25 and y (the amount of Sulfur) generally ranges from 0.10 to 0.30. In order to improve the optical output of the device, facet coatings 30, 32 may be applied to the device. The cleaving of the device to its useful length provides the necessary "mirror" action to provide laser stimulation. The light output of the device may be shifted towards blue by reducing the thickness of active layer 16 and/or by reducing the cadmium content of this layer (u approaches 0).

Figure 1B:
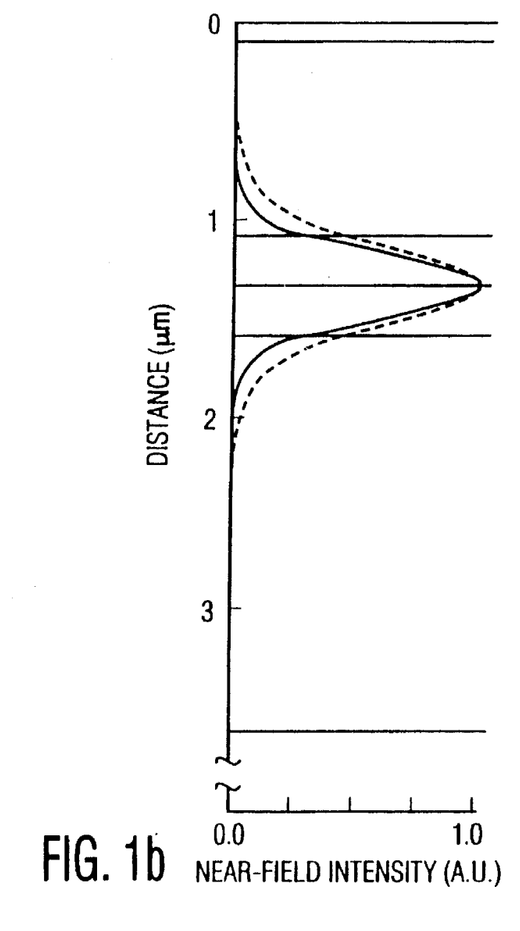

FIG. 1b illustrates the near field intensity (in arbitrary units) of the light generated by the structure of FIG. 1a. The near field pattern for the analogous structure without magnesium (x=0) is shown in the dashed line. It is seen that the structure has improved optical confinement with most of the light confined within the quantum well and guiding layers. A clear improvement is thus seen in the optical confinement for the laser containing $Zn_{1-x}Mg_xS_ySe_{1-y}$ over $Zn_zS_{1-z}Se$. Devices constructed in accordance with the present invention also show improved electrical confinement and a reduction in defects as compared to previous constructions.

The growth of the active layer 16 may be facilitated by the growth of a thin (≈15Å) layer of ZnSe on one or both sides of the active layer. The use of this ZnSe layer or layers can simplify the accurate growth of the active layer. Depending on the application analogous structures having more than 1 active layer may also be grown. Additionally, the structure described above is applicable to index guided lasers as well. The growth of the active layers atop the substrate, in any of the embodiments described herein may be facilitated by the techniques of U.S. patent application Ser. No. 917,538 filed Jul. 21, 1992, the disclosure of which is hereby incorporated by reference.

Figure 2:
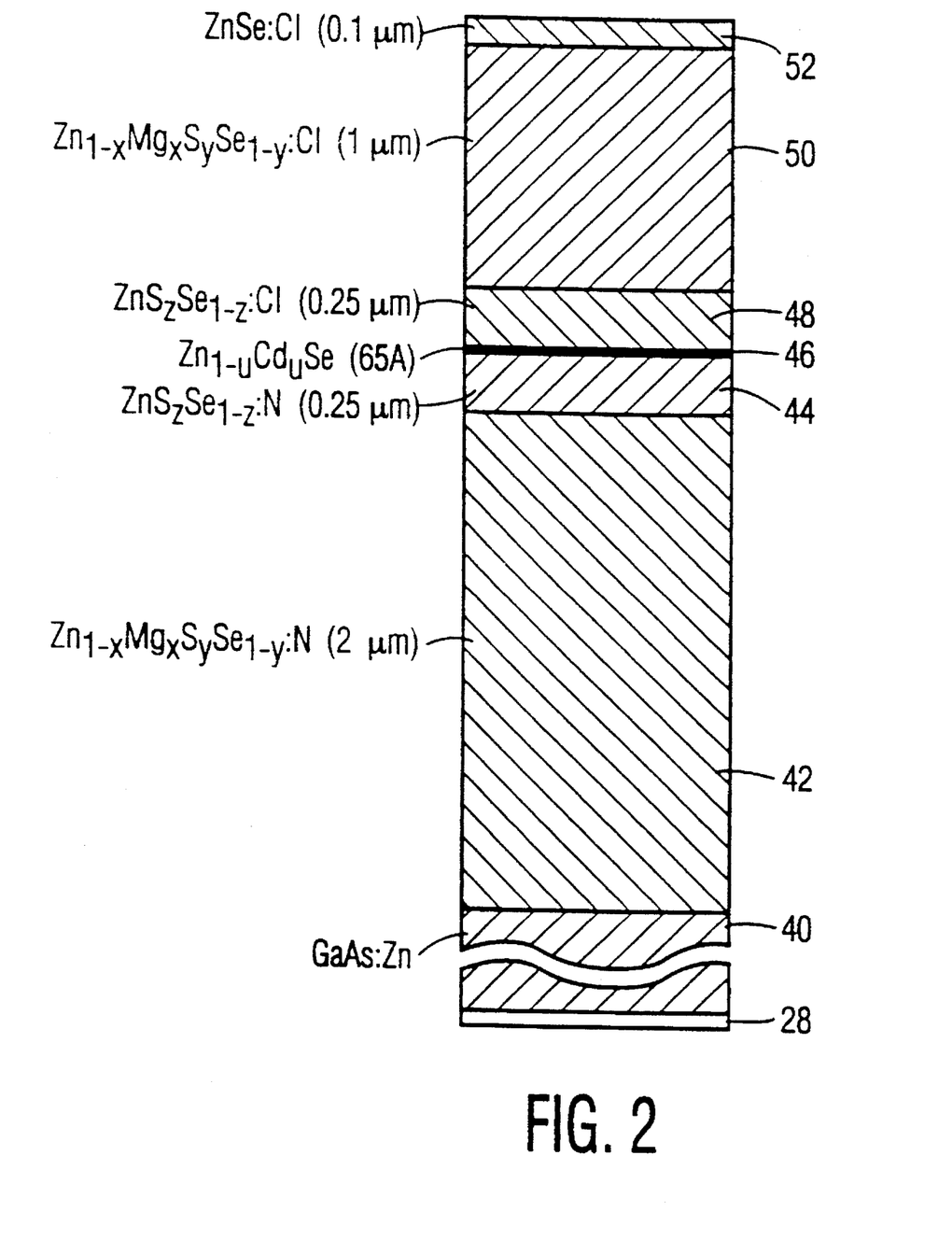
FIG. 2 illustrates a device utilizing a p-type substrate.

In the above described embodiment of FIG. 1a, the substrate and lower layers are n-type with the upper layers p-type. An analogous structure can be grown with the lower layers p-type and the upper layers n-type. In the embodiment of FIG. 2, the substrate 40 is p-type, such as GaAs:Zn with a p-type lower cladding layer 42 of $Zn_{1-x}Mg_xS_ySe_{1-y}$:N disposed atop the substrate and a p-type $ZnS_zSe_{1-z}$:N guiding layer 44. The $Zn_{1-u}Cd_uSe$ active layer 46 remains the same as in FIG. 1a with a $ZnS_zSe_{1-z}$:Cl n-type upper guiding layer 48, n-type $Zn_{1-x}Mg_xS_ySe_{1-y}$:Cl upper cladding layer 50 and a n-type ZnSe:Cl contact layer 52. The doping levels of the layers of the structure of FIG. 2 are generally similar to the levels of the layers in FIG. 1a.

Figures 3, 4:
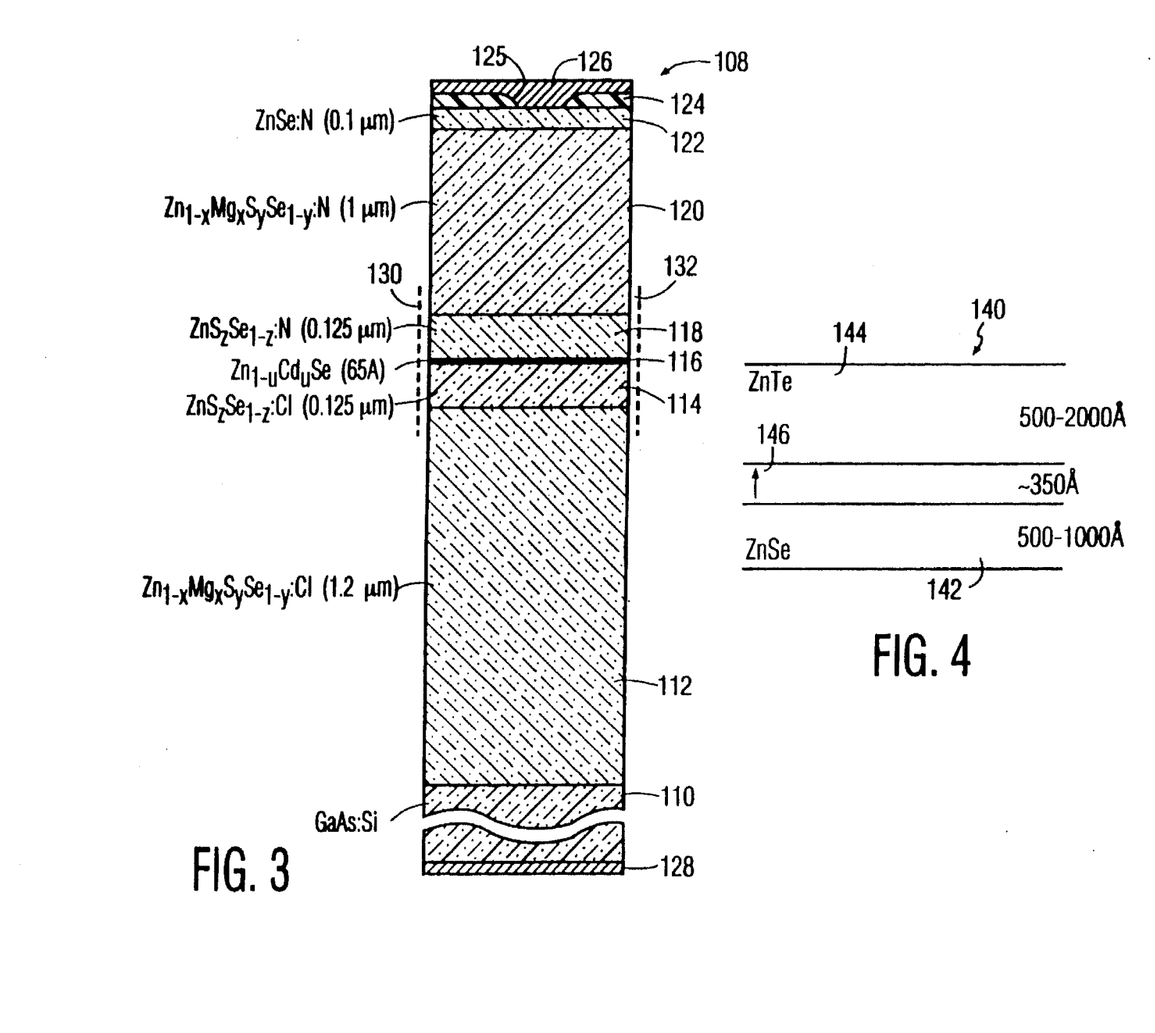
FIG. 3 illustrates a device in which either the p-type guiding layer or both guiding layers are left undoped.
FIG. 4 illustrates an alternate structure for a contact layer which has a lower portion of ZnSe, an upper portion of ZnTe and a graded portion lying therebetween.

FIG. 3 illustrates another embodiment 108 of the laser device. This device is similar to the structure of FIG. 1a but the p-type guiding layer or both guiding layers is left undoped. This structure produces less degradation of the lasing action over time. The structure of device 108 includes a GaAs:Si substrate 110 which, by doping with silicon, is n-type. Grown on the substrate 110 is a cladding layer 112 of $Zn_{1-x}Mg_xS_ySe_{1-y}$:Cl, which, by its doping with Cl is n-type. Grown atop cladding layer 112 is an optical guiding layer 114 of $ZnS_zSe_{1-z}$ which is undoped. Grown atop guiding layer 114 is the active quantum well layer 116 of $Zn_{1-u}Cd_uSe$. Grown on active layer 116 is an undoped guiding layer 118 comprising $ZnS_zSe_{1-z}$. Grown atop guiding layer 118 is a p-type cladding layer 120 of $Zn_{1-x}Mg_xS_ySe_{1-y}$:N. Disposed on layer 120 is a p-type contact layer 122 of ZnSe:N. To provide gain-guided lasers, an insulator layer 124 (which can be polyimide or other suitable materials) with stripe openings 125 of 50 μm width is applied to the top of the contact layer 122. Contacts to the p-ZnSe contact layer 122 and the n-GaAs substrate 110 were made with a Au (gold) layer 126 and a In layer 128, respectively. The device was cleaved to a length of about 1 mm.

As with the embodiment of FIG. 1, the laser structure shown in FIG. 3 was grown by molecular beam epitaxy (MBE) on a (100) GaAs:Si substrate. Source materials were Zn, Se, Cd, Mg, and ZnS. The p- and n-type dopants were N, excited by a plasma source, and Cl (from $ZnCl_2$), respectively. The doping levels ($N_a-N_d$) in the p-ZnSe, and p-$Zn_{1-x}Mg_xS_ySe_{1-y}$ regions are approximately $1\times10^{18}$, and $2\times10^{17}$ cm$^{-3}$, respectively. The doping level in the n-$Zn_{1-x}Mg_xS_ySe_{1-y}$ is $2\times10^{17}$ cm$^{-3}$, except for the first 1000Å of the $Zn_{1-x}Mg_xS_ySe_{1-y}$ layer, which is doped at $2\times10^{18}$ cm$^{-3}$. The $ZnS_zSe_{1-z}$ guiding layers and the active layer are undoped. In an exemplary embodiment the $Zn_{1-u}Cd_uSe$ layer has a u value of 0.2. and in the $ZnS_zSe_{1-z}$ layer the value of z was 0.06. For the $Zn_{1-x}Mg_xS_ySe_{1-y}$ layers, x and y are each approximately 0.1. In this embodiment, the band-gap of the $Zn_{1-x}Mg_xS_ySe_{1-y}$, determined by photoluminescence, is about 2.95 eV (at 4K), and the index of refraction (at room temperature), determined by the prism-coupling method, is 2.625 at 515 nm. The benefits of undoped guiding layers may also be obtained by leaving only the p-side guiding layer 118 undoped.

The thickness of each of the layers is grown in a manner so as to minimize the loss of light in absorbing layers and maximize the amount of light in the active region. By way of example only, useful devices were formed with a n-type cladding layer 112 of 1.2 microns, undoped guiding layers 114, 118 of 0.125 microns, a quantum well layer 116 of 65 Angstroms, a p-type cladding layer 20 of 1 micron, and a p-type contact layer 22 of 0.1 microns. Suitable ranges for u (Cadmium) are from 0 to 0.4, z from 0 to 0.1, y from 0.06 to 1 and x from 0 to 1. However, x and y must be selected so as to provide lattice matching to the GaAs. As before, practical devices generally have x ranging from 0.08 to 0.25 and y from 0.10 to 0.30. In order to improve the optical output of the device, facet coatings 130, 132 may be applied to the device. The cleaving of the device to its useful length provides the necessary "mirror" action to provide laser stimulation. The light output of the device may be shifted towards blue by reducing the thickness of active layer 116 and/or by reducing the cadmium content of this layer (u approaches 0).

The contact layer 122 of ZnSe is subject to a degradation of conductivity over time. An improved contact layer is shown in FIG. 4 which exhibits less degradation. The contact layer shown in FIG. 4 may be utilized with any of the embodiments of FIGS. 1 to 3 or with any suitable semiconductor laser. FIG. 4 illustrates a contact layer 140 which includes a lower portion 142 which is grown atop the upper cladding layer barrier so that the electrical current will be channeled along the central portion 152. Thereafter, after etching away of layers 144, 146, 142 a suitable insulator 154 can also be deposited to restore the upper surface to flatness. Thereafter, a layer of a suitable contact metal such as gold 156 is deposited so that the appropriate electrical contacts may be attached.

Figure 6:
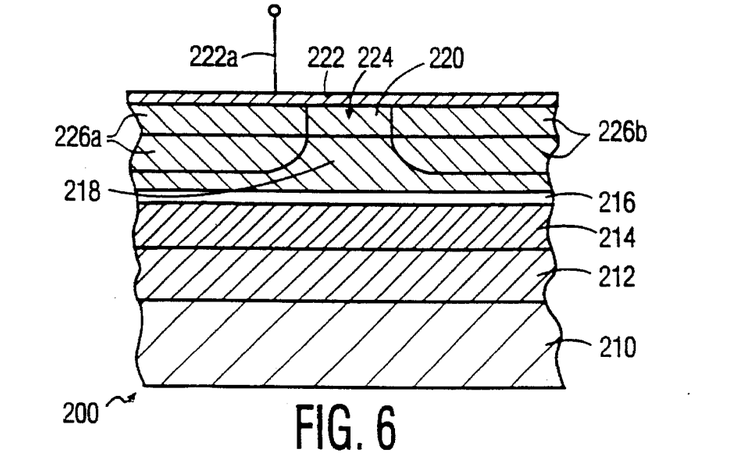
FIG. 6 illustrates in simplified and generalized form a gain-guiding structure made through the use of ion implantation.

Turning now to FIG. 6, there is shown a cross-section of a II/VI semiconductor injection laser structure 200 made using an ion-implantation process in accordance with the present invention. It should be understood that FIG. 6 is intended to show a generic II/VI laser structure in simplified and generalized form for purposes of illustration, and that the method of the present invention may be used to fabricate a wide range of such semiconductor lasers, including, but not limited to, those shown and described previously. To this end, certain layers have been omitted or shown in simplified form, and it will accordingly be understood that when a specified layer is described or recited as being formed or provided on or above another layer, such a description or limitation in not intended to preclude that the two layers may be separated by one or more other layers. In other words, a layer described or recited as being on or above another layer need not necessarily be directly on or above that layer.

In FIG. 6, semiconductor injector laser 200 includes a substrate 210 of III/V semiconductor material, typically a GaAs compound as previously described. Provided on the substrate 210 is a first cladding layer 212 of II/VI semiconductor material, and consists of ZnSe. The upper portion 144 of contact layer 140 is ZnTe. Between lower layer 142 and upper layer 144 is a layer 146 which is graded from ZnSe to ZnTe. Exemplary thicknesses for layers 142, 144 and 146 are shown in FIG. 4 i.e. 500–1000Å for layer 142, approximately 350Å for graded layer 146 and 500–2000Å for layer 144.

Graded layer 146 may be formed by continuously reducing the amount of selenium and increasing the amount of tellurium during the MBE growth of layer 146, the source materials were Zn, Se and Te. Alternatively layer 146 may be "digitally" graded in which layer 146 is laid down in a series of extremely thin layers. The first 20Å of the portion of layer 146 proximate to ZnSe layer 142, would for example, consist of a 2Å layer of ZnTe and a 18Å layer of ZnSe. Proximate to the upper layer 144 of ZnTe, the graded layer would consist of a 2Å layer of ZnSe and a 18Å layer of ZnTe. The central portion of graded layer 146 would consist of 10Å of ZnSe and 10Å of ZnTe. Thus it is seen that the number or thickness of the thin layers of ZnSe or ZnTe increases as the distance to the layer of that material decreases. Digitally graded layers are generally easier to grow by the MBE process than continuously graded layers. However, either grading process provides useful results in providing a transition from ZnSe to ZnTe.

Figure 5:
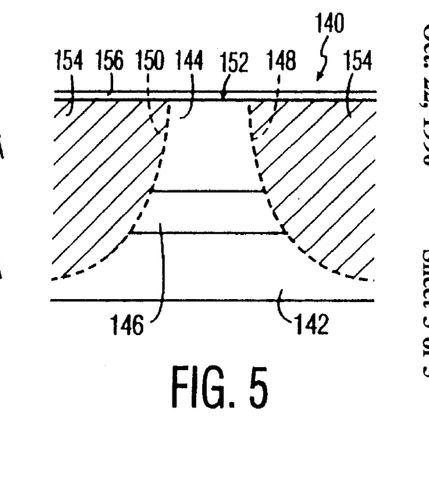
FIG. 5 illustrates the processing of the contact layer of FIG. 4 so as to form a gain-guided device.

In order to form a gain guided device, portions of layers 144, 146 and 142 of contact layer 140 are etched away along lines 148, 150, in FIG. 5 so that the layers 144, 146 are removed except at a central mesa portion 152. Only a rather thin portion of ZnSe layer 142 is left which forms a Schottky typically a ZnSe compound as previously described. A first guiding layer 214, also typically of a ZnSe compound, is provided on the first cladding layer 212. Substrate 210 and layers 212 and 214 are all of the same conductivity type, and may typically be of n-type conductivity.

A quantum well active layer 216, typically of a II/VI material such as a ZnSe compound as previously described, is provided on the first guiding layer 214, and a second guiding layer 218, typically of a ZnSe compound as previously described, is provided on the active layer. The upper-most semiconductor layer of the simplified device shown in FIG. 6 is a second cladding layer 220 of II/VI material, typically a ZnSe compound as described above. Second guiding layer 218 and second cladding layer 220 are of a second conductivity type, in this example of p-type conductivity.

The simplified laser structure of FIG. 6 is completed by a metallic contact layer 222 provided atop second cladding layer 220. This metallic contact layer may be fabricated of Au, Pt, Ti, combinations thereof, or any other suitable contact material. As noted above, the device illustrated in FIG. 6 is shown in simplified and generalized form, to exemplify the type of device that can be made using the method of the present invention. However, the method of the present invention should be understood to apply broadly to other laser configurations of this general type which may differ from the simplified depiction shown in FIG. 6. Thus, for example, the device structure may also include a semiconductor contact layer portion of II/VI material interposed between the second cladding layer 220 and the contact layer 222 shown in FIG. 6, as illustrated, for example, by contact layer 22 between metallic contact layer 26 and second cladding layer 20 in FIG. 1a. Alternative contact layer configurations are shown in FIG. 2, FIG. 3 and FIG. 4.

In accordance with the invention, a gain-guided device analogous to that shown in FIG. 5 is achieved in the structure of FIG. 6 without the necessity of etching to form central mesa portion 152 and then providing suitable insulator portions 154, a relatively complex, time-consuming and expensive process. In FIG. 6, an equivalent central mesa portion 224 is formed by ion implantation into the second cladding layer 220 and the second guiding layer 218 to create implanted blocking layer portions 226a and 226b of higher resistivity in the second cladding layer and the second guiding layer on both sides of the central mesa portion 224, with the central mesa portion forming a stripe-shaped (in a direction perpendicular to the plane of the figure) lateral confinement region of lower resistivity in the central mesa portion 224 of the second cladding layer and the second guiding layer.

Figure 7A:
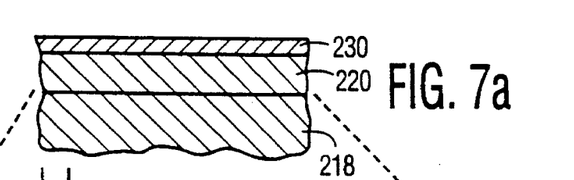
FIGS. 7a–7e illustrate two methods in accordance with the invention of making devices of the general type shown in FIG. 6.
Figure 7B:
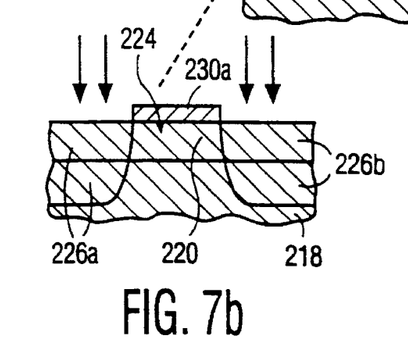
Figure 7C:
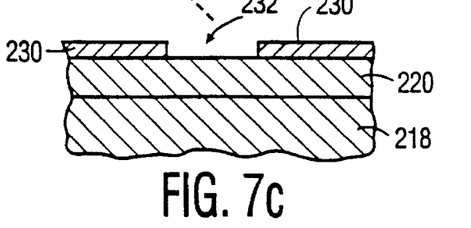

In accordance with the invention, several different techniques may be used to fabricate structures of the type shown in FIG. 6. In one simple technique, a photoresist layer 230 can be applied over second cladding layer 220 as shown in FIG. 7a and then patterned using conventional photoresist patterning techniques to form a stripe-shaped (in a direction perpendicular to the plane of the figure) mask 230a as shown in FIG. 7b. Ion implantation is then carried out, typically using ions of nitrogen or oxygen, into the upper surface in the direction shown by the arrows in FIG. 7b to create the implanted blocking layer portions 226a and 226b of higher resistivity in the second cladding layer and the second guiding layer on both sides of the central mesa portion 224. The mask 230a is then removed and a contact layer such as layer 222 shown in FIG. 6 is applied. In one illustrative embodiment, nitrogen ions at 50 KeV and a dose of $3\times10^{15}/cm^2$ were used to achieve an implantation depth of 0.4 microns, with a stripe width of about 50 microns. Since the various masking, implantation and other fabrication steps mentioned herein are known per se, they are not described in further detail, as it will be apparent to one of ordinary skill in the art how these techniques are to be applied in light of the present disclosure.

The method of the present invention is capable of forming functional blocking layer portions 226a and 226b even at very shallow depths, but in accordance with a preferred embodiment of the invention, a deeper implantation is carried out, to a sufficient depth such that the implanted blocking layer portions 226a and 226b extend through all of the second cladding layer 220 and a major portion of the second guiding layer 218, as shown in FIG. 6, as well as any further semiconductor layers, such as a semiconductor contact layer portion, that may be present above second guiding layer 218, and the implantation step can be continued until the implanted blocking layer portions extend down sufficiently far to be adjacent, but not touching, the active layer 216. By making the implantation depth, and thus the implanted blocking layer portions, deeper, current spreading from the central mesa portion 224 is reduced, thus increasing efficiency.

Figure 7D:
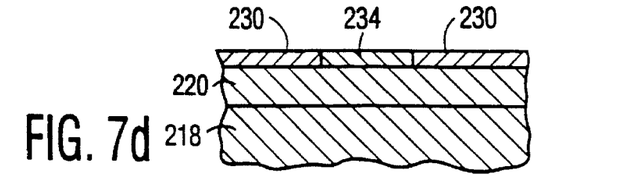

In a second embodiment of the invention, again starting with the structure at the stage shown in FIG. 7a, the photoresist layer 230 is patterned to form a stripe-shaped aperture 232, which may be, for example, 50 microns wide, above the portion of second cladding layer 220 where the central mesa portion is to be formed. A metal layer portion 234 is then formed in the aperture 232, as shown in FIG. 7d. This metal layer portion 234, which is stripe-shaped in a direction perpendicular to the plane of the figure, may be made of Au or other suitable contact metal, and may be deposited by sputtering, electrochemical deposition or any other suitable deposition method. The remaining portions of the photoresist layer 230 are then removed, such as by etching, and implantation is performed as previously described using the stripe-shaped metal layer 234 as an implantation mask to form the implanted blocking layer portions 226a and 226b.

Figure 8A:
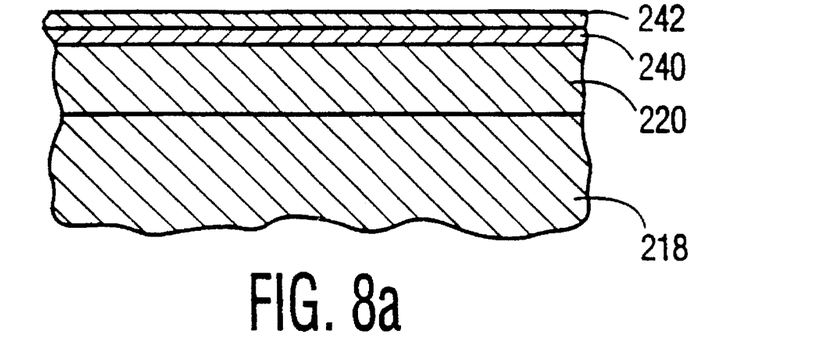
FIGS. 8a–8c illustrate a third method in accordance with the invention of making devices of the general type shown in FIG. 6.
Figure 8B:
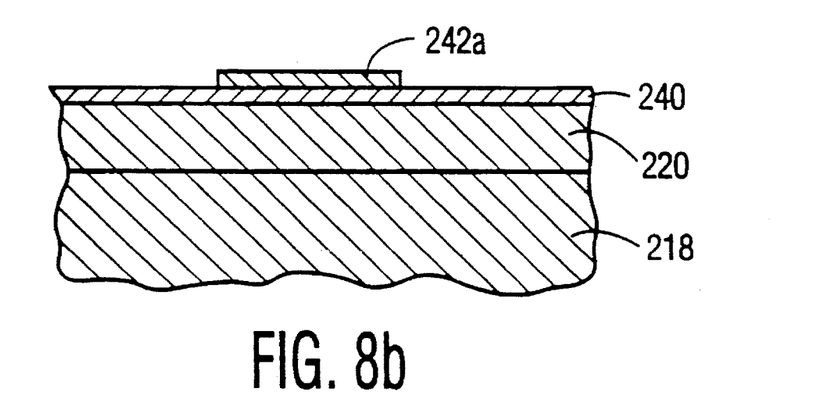
Figure 8C:
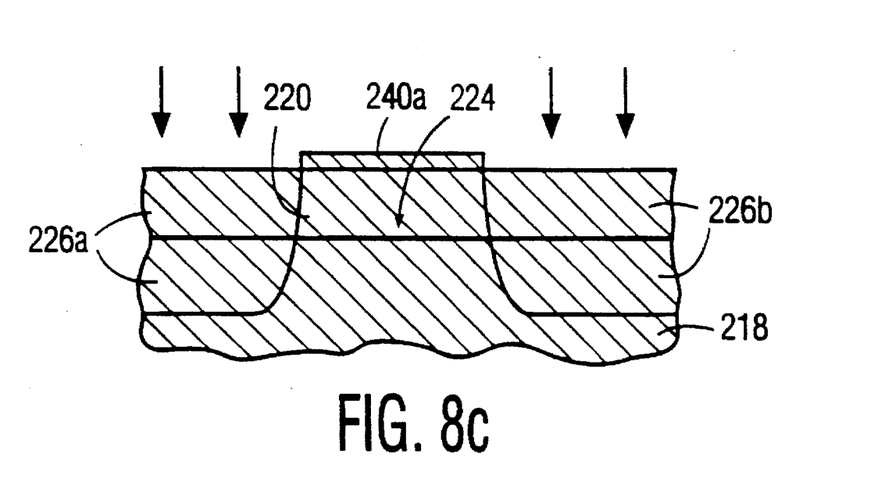

In a third embodiment of a method in accordance with the invention, a layer 240 of a suitable contact metal, such as one of the contact metals previously described, is applied on the second cladding layer 220, and a photoresist layer 242 is applied on the contact metal layer 240, as shown in FIG. 8a. The photoresist layer 242 is then patterned to form a stripe-shaped layer portion 242a, as shown in FIG. 8b, with the stripe extending in a direction perpendicular to the plane of the figure as in previous embodiments. The stripe-shaped layer portion 242a of the photoresist layer 242 is then used as an etching mask in a conventional etching step to remove those portions of the contact metal layer 240 not lying beneath the stripe-shaped layer portion 242a, and the stripe-shaped layer portion of the photoresist layer 242a is then removed, to form the surface structure having a stripe-shaped mask 240a as shown in FIG. 8c. Ion implantation is then carried out in the direction of the arrows as shown in FIG. 8c and previously described, to create the implanted blocking layer portions 226a and 226b.

Figure 7E:
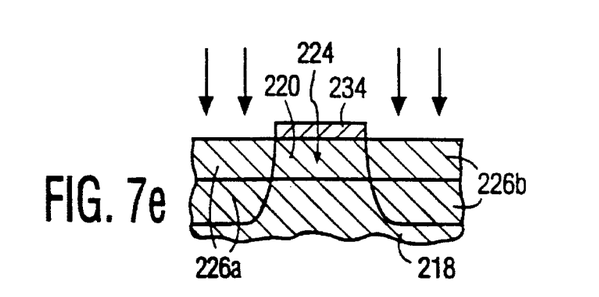

In the embodiments shown in FIGS. 7e and 8c, where the implantation mask is metal, the mask portion (234, 240a) may additionally be used as an electrical contact or portion thereof in the finished product. Thus, for example, the metal mask portion 234 or 240a can be left in place after the implantation process, and one or more metallic contact layers, of such materials as Ti, Pt or Au can be applied over the entire surface of the device, including the mask. Since the blocking layer portions 226a and 226b are of higher resistivity than that of the lateral confinement region 224, providing a metallic contact across the entire surface of the device will not degrade device efficiency. Additionally, as shown in FIG. 6, by providing a contact layer (222) over the entire surface, it is no longer necessary to accurately align the electrical connection 222a, shown schematically in FIG. 6, directly above the relatively narrow lateral confinement region.

Although the present invention has been described in conjunction with preferred embodiments, it is to be understood that modifications and variations may be resorted to without departing from the spirit and scope of the invention, as those skilled in the art will readily understand. Such modification and variations are considered to be within the purview and scope of the invention and the appended claims.

What is claimed is:

1. A method of making a stripe-geometry semiconductor laser structure of the type having a substrate of III/V semiconductor material, and, disposed successively above said substrate, a first cladding layer of II/VI semiconductor material, a first guiding layer of II/VI material, an active layer of II/VI material, a second guiding layer of II/VI material, a second cladding layer of II/VI material, and a contact layer, said method comprising the steps of:

forming a stripe-shaped mask against ion implantation on a surface of said second cladding layer;

ion implanting a dopant suitable for increasing the resistivity of II/VI semiconductor material into said second cladding layer and said second guiding layer, using said stripe-shaped mask, to define implanted blocking layer portions of higher resistivity in said second cladding layer and said second guiding layer on both sides of said stripe-shaped mask and a stripe-shaped lateral confinement region of lower resistivity in said second cladding layer and said second guiding layer beneath said stripe-shaped mask; and providing said contact layer on said second cladding layer at least above said stripe-shaped lateral confinement region.

2. A method of making a stripe-geometry semiconductor laser structure as in claim 1, wherein said dopant is Nitrogen.

3. A method of making a stripe-geometry semiconductor laser structure as in claim 1, wherein said dopant is Oxygen.

4. A method of making a stripe-geometry semiconductor laser structure as in claim 1, wherein said stripe-shaped mask is formed by applying a photoresist layer on said second cladding layer, and patterning said photoresist layer to form said stripe-shaped mask.

5. A method of making a stripe-geometry semiconductor laser structure as in claim 1, wherein said stripe-shaped mask is formed by applying a photoresist layer on said second cladding layer, patterning said photoresist layer to form a stripe-shaped aperture therein, providing a metal layer at least in said aperture, and removing said photoresist layer.

6. A method of making a stripe-geometry semiconductor laser structure as in claim 5, wherein said contact layer comprises said metal layer.

7. A method of making a stripe-geometry semiconductor laser structure as in claim 1, wherein said stripe-shaped mask is formed by applying a metal layer on said second cladding layer, applying a photoresist layer on said metal layer, patterning said photoresist layer to form a stripe-shaped layer portion, removing that portion of the metal layer not lying beneath said stripe-shaped layer portion, and removing said stripe-shaped layer portion.

8. A method of making a stripe-geometry semiconductor laser structure as in claim 7, wherein said contact layer comprises that portion of the metal layer lying beneath said stripe-shaped layer portion.

9. A method of making a stripe-geometry semiconductor laser structure as in claim 1, wherein said ion implanting step is carried out to an implantation depth such that said implanted blocking layer portions extend through all of said second cladding layer and a major portion of said second guiding layer.

10. A method of making a stripe-geometry semiconductor laser structure as in claim 9, wherein said ion implantation step is carried out to an implantation depth such that said implanted blocking layer portions are adjacent said active layer.

11. A method of making a stripe-geometry semiconductor laser structure as in claim 10, wherein said ion implantation step is carried out to an implantation depth of about 0.4 micron.

* * * * *